(12) United States Patent
Yang et al.

(10) Patent No.: US 7,848,139 B2
(45) Date of Patent: Dec. 7, 2010

(54) MEMORY DEVICE STRUCTURES INCLUDING PHASE-CHANGE STORAGE CELLS

(75) Inventors: Yizhang Yang, Sunnyvale, CA (US); Haiwen Xi, Prior Lake, MN (US); Yiming Shi, Maple Grove, MN (US); Kaizhong Gao, Eden Prairie, MN (US); Jun Ouyang, Bloomington, MN (US); Song S. Xue, Edina, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 268 days.

(21) Appl. No.: 12/233,389

(22) Filed: Sep. 18, 2008

(65) Prior Publication Data

US 2010/0067288 A1 Mar. 18, 2010

(51) Int. Cl.
*G11C 11/00* (2006.01)
(52) U.S. Cl. ...................................... 365/163; 365/148
(58) Field of Classification Search ................. 365/163, 365/148; 257/295
See application file for complete search history.

(56) References Cited

U.S. PATENT DOCUMENTS

| | | | |
|---|---|---|---|
| 6,597,031 B2 | 7/2003 | Kuge | |
| 6,621,095 B2 | 9/2003 | Chiang et al. | |
| 6,791,107 B2 | 9/2004 | Gill et al. | |
| 6,841,793 B2 | 1/2005 | Lee | |
| 6,869,841 B2 | 3/2005 | Xu | |
| 6,969,633 B2 | 11/2005 | Dennison | |
| 6,969,869 B2 | 11/2005 | Hudgens et al. | |
| 6,972,430 B2 | 12/2005 | Casagrande et al. | |
| 7,005,666 B2 | 2/2006 | Dennison | |
| 7,042,001 B2 | 5/2006 | Kim et al. | |
| 7,049,623 B2 | 5/2006 | Lowrey | |
| 7,122,824 B2 | 10/2006 | Khouri et al. | |
| 7,129,531 B2 | 10/2006 | Fournier et al. | |
| 7,196,351 B2 | 3/2007 | Chiang et al. | |
| 7,205,564 B2 * | 4/2007 | Kajiyama | 257/40 |
| 7,208,751 B2 * | 4/2007 | Ooishi | 257/5 |
| 7,214,957 B2 | 5/2007 | Ryoo et al. | |
| 7,227,171 B2 | 6/2007 | Bez et al. | |
| 7,630,233 B2 * | 12/2009 | Kato et al. | 365/163 |

OTHER PUBLICATIONS

Hudgens, S., et al., "Overview of Phase-Change Chalcogenide Nonvolatile Memory Technology", Mrs. Bulletin, Nov. 2004, pp. 829-832.

(Continued)

*Primary Examiner*—Anh Phung
(74) *Attorney, Agent, or Firm*—Fredrikson & Bryon, P.A.

(57) ABSTRACT

A conductive write line of a memory device includes a resistive heating portion for setting and resetting a phase-change material (PCM) storage cell of the device. A dielectric interface extends between the resistive heating portion of the write line and a side of the storage cell, and provides electrical insulation while allowing for thermal coupling between the resistive heating portion and the storage cell. A width of the resistive heating portion of the write line may be less than a width of the storage cell and/or may be less than a width of adjacent portions of the write line, between which the resistive heating portion extends. The side of the storage cell may define a channel of the storage cell through which the write line passes, such that the resistive heating portion is located within the channel.

23 Claims, 5 Drawing Sheets

OTHER PUBLICATIONS

Hwang, Y.N., et al., "Writing Current Reduction for High-density Phase-change RAM", IEDM 03, 2003, pp. 893-896, Advanced Technology Development, and *Process Development Semiconductor R&D Div., Samsung Electronics Co., Ltd San #24, Nongseo-Ri, Hiheung-Eup, Yong in, Kyunggi-Do 449-900 Korea. 0-7803-7872-5/03.

Lacaita, A.L., "Phase change memories: State-of-the-art, challenges and perspectives", Solid-State Electronics 50 (2006), pp. 24-31.

Lai, Stefan, et al., "OUM—A 180 nm Nonvolatile Memory Cell Element Technology For Stand Alone and Embedded Applications", IEDM01, 2001, pp. 803-806, Intel Corporation, RN3-01, 2200 Mission College Blvd., Santa Clara, CA 95052-8119. 0-7803-7050-3/01.

Pirovano, A., et al., "Scaling Analysis of Phase-Change Memory Technology", IEDM03, 2003, pp. 699-702, DEI and IFN-CNR Sez. Milano, Politecnico di Milano, Milano, Italy, STMicroelectronics, Central R&D, Agrate Brianza, Italy, Ovonyx Inc., Rochester Hills, MI, USA. 0/7803-7872-5/03.

Pirovano, Agostino, et al., "Reliability Study of Phase-Change Nonvolatile Memories", IEEE Transactions on Device and Materials Reliability, vol. 4, No. 3., pp. 422-427, Sep. 2004.

Sadeghipour, Sadegh M., et al., "Phase Change Random Access Memory, Thermal Analysis", IEEE 2006, Data Storage Systems Center, Department of Electrical and Computer Engineering, Carnegie Mellon University, Pittsburgh, PA 15213, pp. 660-665, 0-7803-9524-7/06.

* cited by examiner

MEMORY DEVICE STRUCTURES INCLUDING PHASE-CHANGE STORAGE CELLS

BACKGROUND

Phase-change random access memory (PCRAM) devices, which are known in the art, employ storage cells that are each typically formed by a layer of phase-change, or chalcogenide material, for example, a $Ge_2Sb_2Te_5$ alloy (GST). Each phase-change material (PCM) storage cell may be programmed between crystalline and amorphous structural states, wherein an electrical resistivity of the cell is significantly higher when the PCM is in the amorphous state than when the PCM is in the crystalline state. Each programmed cell may be read by biasing the cell and sensing the current passing therethrough. Programming, or writing to each PCM storage cell is typically accomplished by applying an appropriate current pulse through each cell, for example, a pulse having a relatively high amplitude and relatively short duration, to change the PCM to the amorphous state (RESET), or a pulse having a medium amplitude and a relatively long duration, to switch the PCM to the crystalline state (SET). (The RESET state may be logical '0', while the SET state a logical '1'.) Each PCM is typically sandwiched between an upper contact and a lower resistive electrode, such that the current pulses being driven through each PCM storage cell induces the phase transition, via heat generation, close to the interface with the resistive electrode, or heater.

In order to increase programming efficiency, a contact area between the PCM and the resistive electrode/heater is typically made as small as practicable, thereby increasing the current density, for a given current required to set and reset the PCM storage cell. In order to increase programming endurance, attention has been paid to the quality of the interface between the PCM and the resistive electrode/heater, for example, in order to reduce separation at the interface and to prevent significant interfacial diffusion from the electrode into the PCM. However, there is still a need for new memory device structures, which can effectively increase the programming endurance and/or efficiency of the PCM storage cells thereof; such structures are described in the present disclosure.

SUMMARY

A conductive write line of a memory device, according to embodiments of the present disclosure, includes a resistive heating portion extending alongside a first side of a PCM storage cell, for setting and resetting the storage cell; a dielectric interface, which provides electrical insulation while allowing for thermal coupling between the resistive heating portion and the storage cell, extends between the resistive heating portion of the write line and the first side of the storage cell. The memory device further includes a conductive read line coupled to the storage cell for passing sensing current through the storage cell.

The storage cell may further include a second side and a third side, which are opposite one another, to define a width of the storage cell, and between which the first side extends; a width of the resistive heating portion, which extends between the second and third sides of the storage cell, may be less than the width of the storage cell and, in some embodiments, also less than a width of the adjacent portions of the write line. According to some embodiments, the first side of the PCM storage cell defines a channel of the storage cell, through which the write line extends, such that the resistive heating portion of the write line is located within the channel.

BRIEF DESCRIPTION OF THE DRAWINGS

The following drawings are illustrative of particular embodiments of the disclosure and therefore do not limit the scope of the invention. The drawings are not to scale (unless so stated) and are intended for use in conjunction with the explanations in the following detailed description. Embodiments of the disclosure will hereinafter be described in conjunction with the appended drawings, wherein like numerals denote like elements.

DETAILED DESCRIPTION

The following detailed description is exemplary in nature and is not intended to limit the scope, applicability, or configuration of the invention in any way. Rather, the following description provides practical illustrations for implementing exemplary embodiments.

Figure 1A:
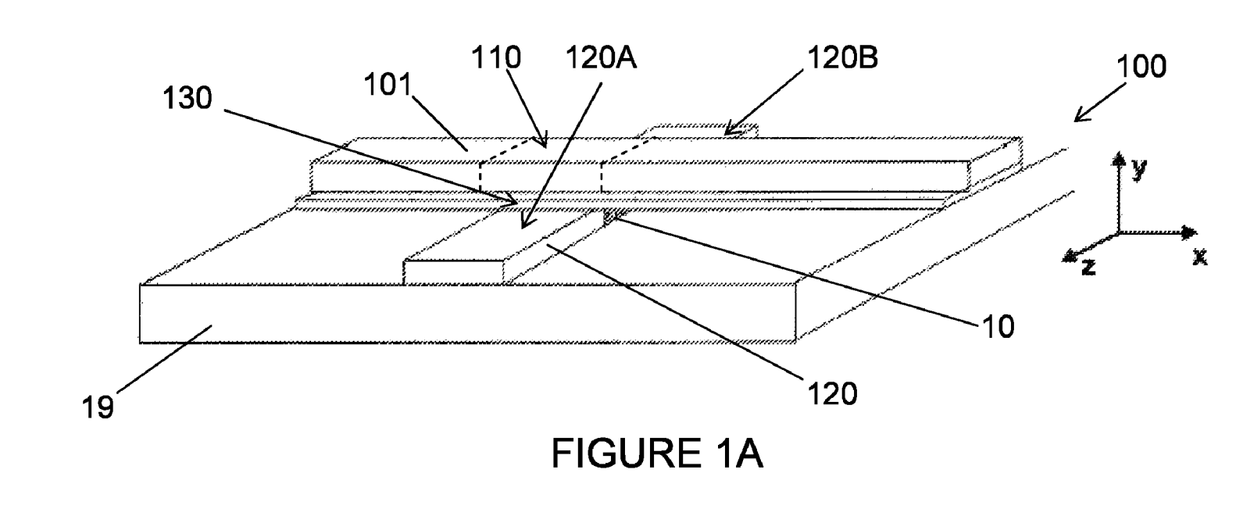
FIG. 1A is perspective view of a portion of a memory array, according to some embodiments.

FIG. 1A is perspective view of a portion of a memory array, according to some embodiments. FIG. 1A illustrates a memory device 100 of the array supported on a silicon substrate 19 and including a phase-change material (PCM) storage cell 10, which is located at an intersection of a conductive read line 120 (extending in the z-direction) and a conductive write line 101 (extending in the x-direction). PCM storage cell may be formed from any chalcogenide material, an example of which includes, without limitation, a $Ge_2Sb_2Te_5$ alloy. Those skilled in the art will appreciate that the memory array may include on the order of 1,000 or more read and write lines, which each intersect at a storage cell, like cell 10, and that each cell 10 may further include a transistor, such as a MOSFET, to selectively drive current therethrough. For clarity in illustration, only a single cell 10 of the array is shown, and the associated transistor is not detailed. According to the illustrated embodiment, write line 101 includes a resistive heating portion 110 which extends alongside PCM cell 10 and is separated therefrom by an interface 130 of dielectric material, for example $SiO_2$, in which read line 120 and cell 100 are embedded. (The extent of the dielectric material is shown limited in FIG. 1A, for illustration purposes, so that read line 120 and cell 10 are visible.)

Figure 1B:
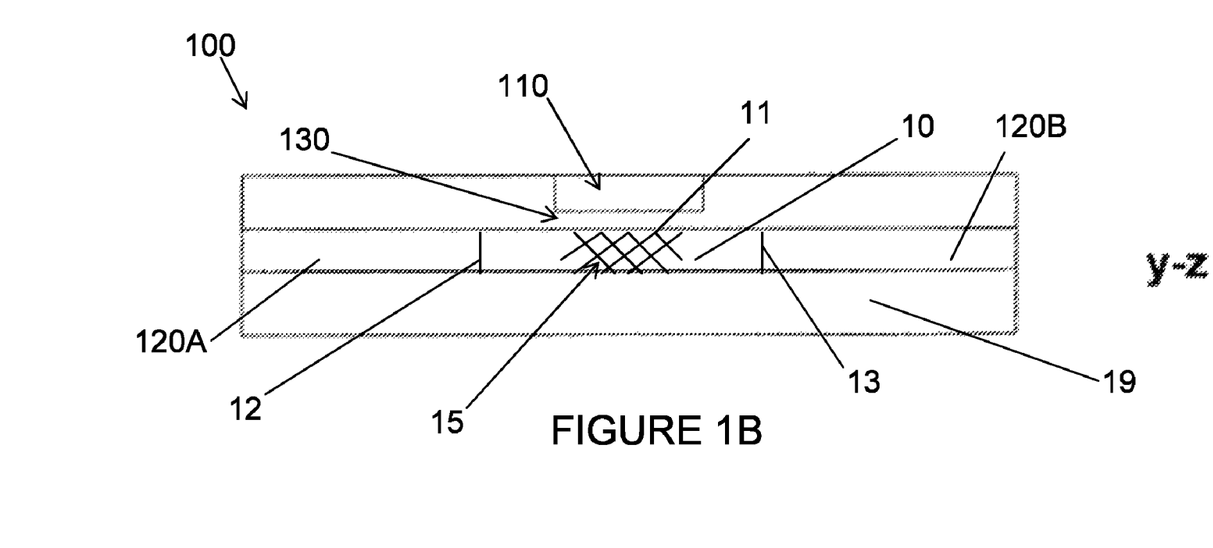
FIG. 1B is a section view, in a y-z plane (denoted in FIG. 1A), of a memory device included in the array of FIG. 1A, according to some embodiments.

FIG. 1B is a section view, in a y-z plane (denoted in FIG. 1A), of memory device 100, according to some embodiments, wherein resistive heating portion 110 is shown extending alongside a first side 11 of PCM storage cell 10. FIG. 1B illustrates heating portion 110 having a width, in the z-direction (FIG. 1A), that is less than a width of storage cell 10, so that a transition zone 15 of PCM storage cell 10 is substantially confined and separated from first and second portions 120A, 120B of read line 120, which are coupled to second and third sides 12, 13, respectively, of PCM storage cell.

According to the illustrated embodiment, PCM storage cell 10 is programmed when a potential is applied to drive a current pulse through write line 101, so that thermal coupling, through dielectric interface 130, between resistive heating portion 110 and transition zone 15, can SET and RESET PCM storage cell 10. A current pulse, for example, having a peak magnitude of around 0.5 milliamps (mA), and a duration of less than approximately 100 nanoseconds, can heat a zone 15 of PCM storage cell 10, which is in proximity to heating portion 110, to a temperature above a melting point of the PCM in order to cause transition zone 15 to change into an amorphous state (RESET), which has a relatively high resistivity. For the opposite change, from the amorphous to the crystalline state, a current pulse having a somewhat lower peak magnitude is driven through write line 101 to heat zone 15 of PCM storage cell 10 to a temperature just below the melting point, but high enough to drive zone 15 back to the crystalline state (SET), which has a relatively low resistivity. Dielectric interface 130 may have a thickness of approximately 20 nanometers (nm) and a thermal conductivity on the order of one Watt/meter×Kelvin (W/m-K), so as to allow for the thermal coupling between resistive heating portion 110 and PCM storage cell 10, which induces the phase change from a SET condition to a RESET condition, or visa versa, of transition zone 15 of cell 10. In order to read storage cell 10, a current is driven through read line 120.

With reference to FIGS. 1A-B, it may be appreciated that paths for heat and electricity, during programming, are independent of one another, so that thermal performance and electrical performance may be independently optimized for device 100. Reducing programming current can be achieved through optimization of material, geometry and dimensions of write line 101, as well as relative locations of write line 101 and PCM storage cell 10, rather than changing material characteristics of cell 10 and/or significantly decreasing a contact area between cell 10 and heating portion 110, which could lead to a reduction in programming endurance. Although FIG. 1A illustrates the width (z-direction) of resistive heating portion 110 being approximately equal to that of adjacent portions of write line 101, according to some alternate embodiments, write line 101 necks down at resistive heating portion 110 so that the width thereof is less than that of the adjacent portions of write line 101. Furthermore, although resistive heating portion 110 is shown extending approximately coplanar with adjacent portions of write line 101, according to alternate embodiments, each opposing terminal end of heating portion 110 includes a contact for coupling with a write line that extends in a separate plane from the extent of heating portion 110.

Figure 2A:
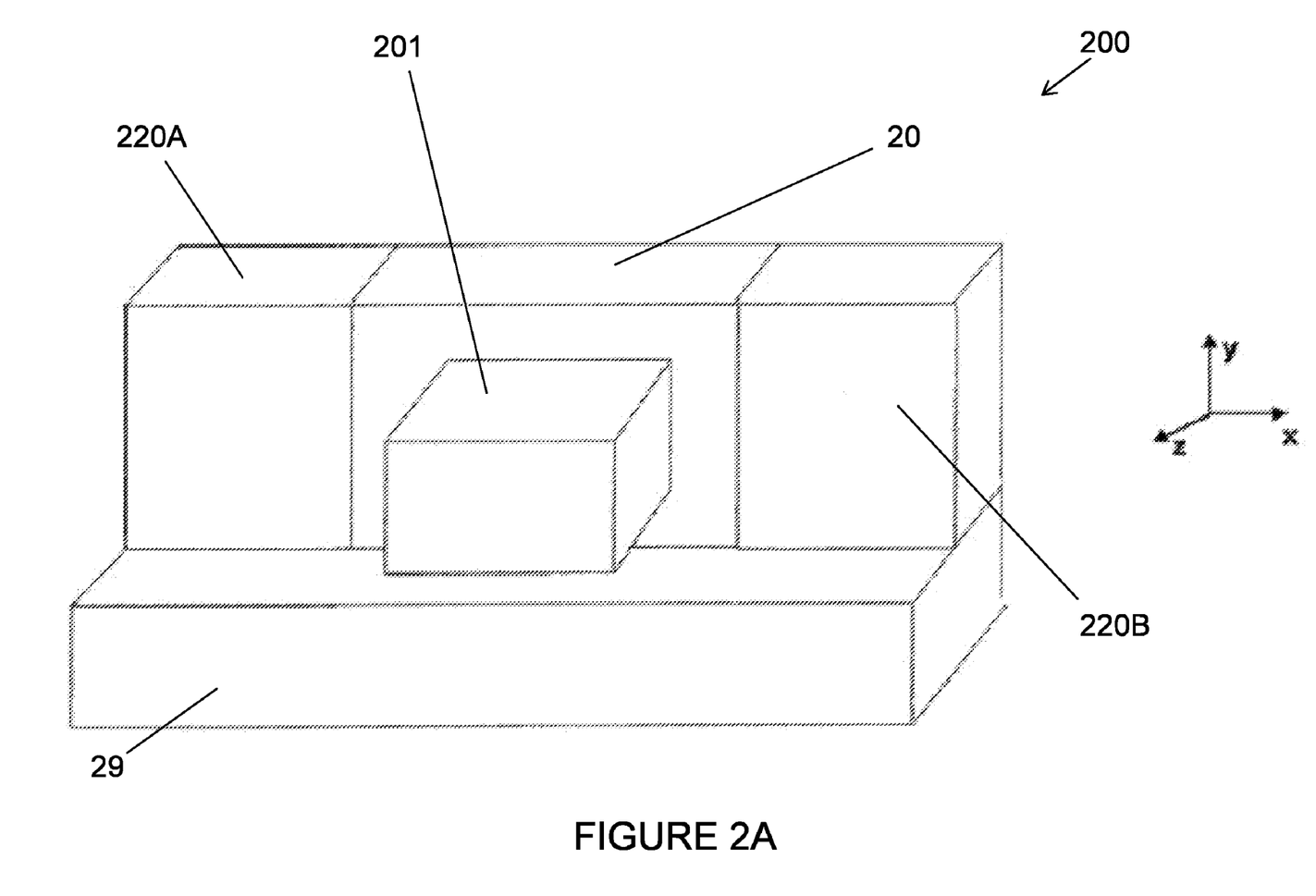
FIG. 2A is a perspective view of a memory device, according to some alternate embodiments.
Figure 2B:
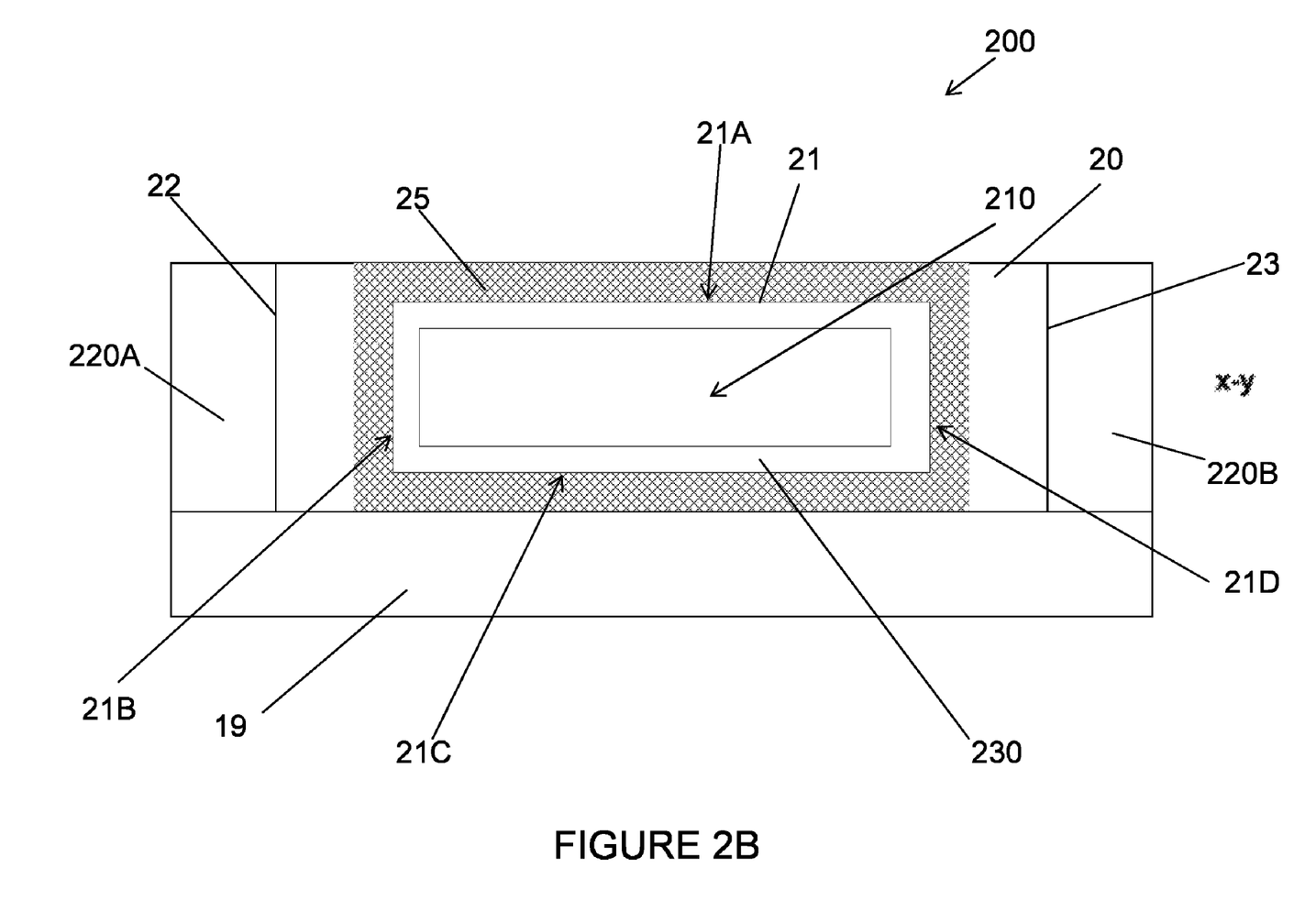
FIG. 2B is a section view, in an x-y plane (denoted in FIG. 2A), of the memory device of FIG. 2A, according to some embodiments.

With further reference to FIG. 1B, it may also be appreciated that some of the heat generated in heating portion 110 may be dissipated into the surrounding dielectric material, and that, by reducing the amount of dissipated heat, the programming current for PCM storage cell 10 may be reduced. FIG. 2A is a perspective view of a memory device 200, according to some alternate embodiments, which has a structure devised by thermal optimization. Memory device 200 is shown being supported on a silicon substrate 29, which may be part of a memory array, as previously described, in conjunction with FIG. 1A. FIG. 2A illustrates device 200 including a conductive write line 201 extending through a channel of a PCM storage cell 20. With reference to FIG. 2B, which is a section view, in an x-y plane (denoted in FIG. 2A), of memory device 200, storage cell 20 is shown including a first side 21, which is segregated into four sections 21A, 21B, 21C and 21D to form the channel.

FIG. 2B illustrates a dielectric material, for example, $SiO_2$, forming an interface 230 between each section 21A, 21B, 21C, 21D of first side 21 and a heating portion 210 of write line 201. FIG. 2B further illustrates sections 21A and 21C of first side 21 extending between a second side 22 and a third side 23 of PCM cell 20, wherein a first portion 220A of a read line is coupled to second side 22, and a second portion 220B of a read line is coupled to third side 23. According to the illustrated embodiment, a transition zone 25, indicated with cross-hatching, of PCM storage cell 20 extends into all four portions thereof; the transition zone changes state, as previously described, when a current pulse is driven through write line 201 to heat resistive heating portion 210 thereof.

Figure 2C:
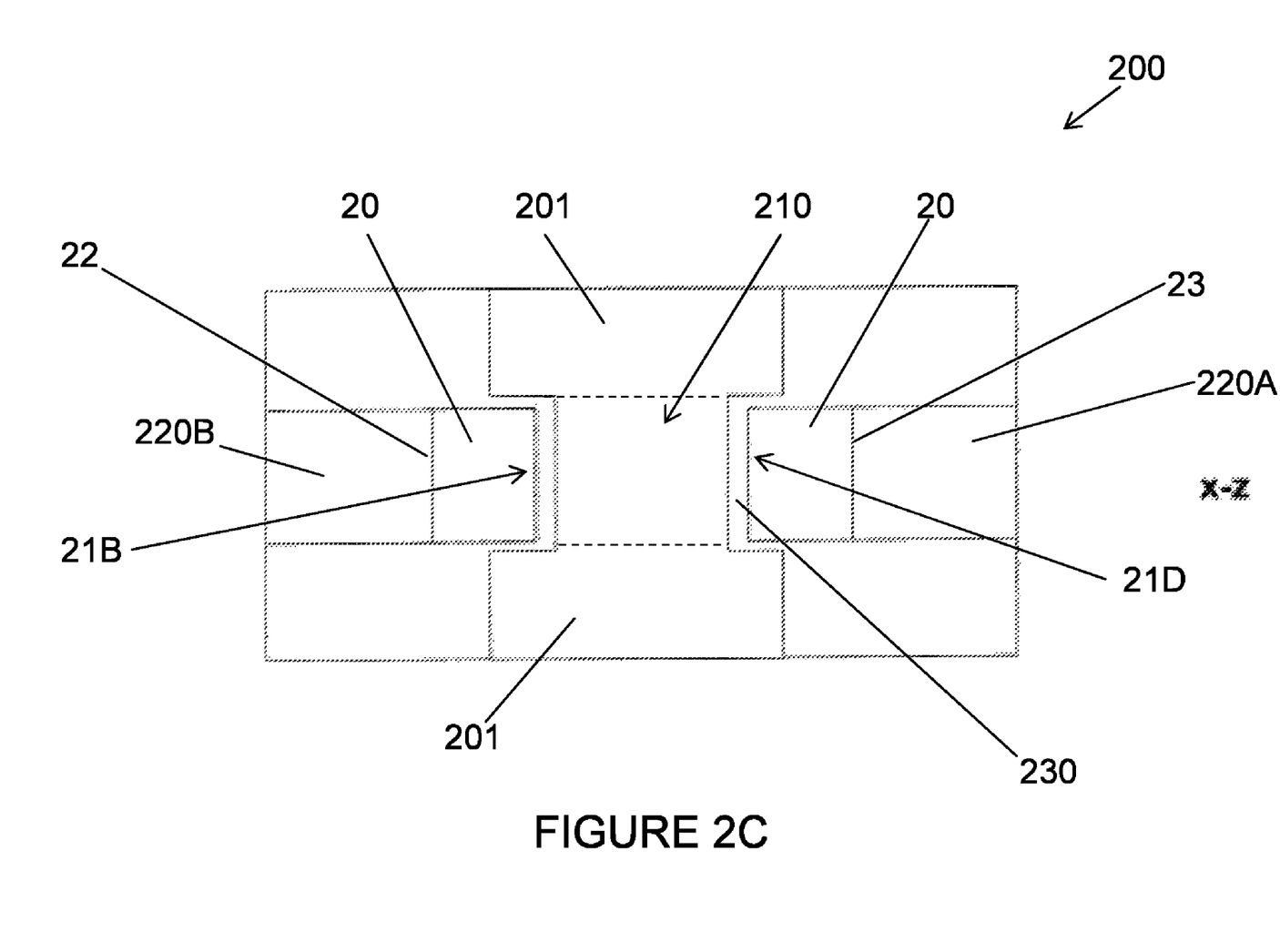
FIG. 2C is a section view, in an x-z plane (denoted in FIG. 2A), of the memory device of FIGS. 2A-B, according to some embodiments.

FIG. 2C is a section view, in an x-z plane (denoted in FIG. 2A), of memory device 200, wherein heating portion 210 of write line 201 is shown as a necked down section thereof, such that a width of heating portion 210, in the x-direction, is less than that of adjacent portions of write line 201. According to some preferred embodiments, this width of resistive heating portion 210 is less than approximately 70 nm, and resistive heating portion 210 may extend, in the z-direction, alongside first side 21 of PCM storage cell 20, over a distance which is also less than approximately 70 nm. Portions of write line 201, on either side of resistive heating portion 210, may extend approximately coplanar with heating portion 210, or each opposing terminal end of heating portion 210 may include a contact for a coupling with a write line that extends in a separate plane from resistive heating portion 210.

With further reference to FIGS. 2A-C, a finite element model was generated for device 200, and a steady state simulation was performed, in which the electrical and thermal properties shown in Table 1 were incorporated. A contact area between heating portion 210 and PCM storage cell 20, which is associated with each zone 25 of PCM storage cell 20 (FIG. 2B), was set at 4225 $nm^2$ (65 nm×65 nm) for the model. The simulation indicated that a programming current of 0.5 mA, with a corresponding voltage drop of around 1V across write line 201, raises the temperature of zones 25 to above 750° C., which is above the material melting point (~620° C.) for RESET.

TABLE 1

| | Electrical Resistivity (Ω-m) | Thermal Conductivity (W/m-K) |
|---|---|---|
| PCM storage cell ($Ge_2Sb_2Te_5$ alloy) | — | 0.4 |
| Heating portion of Write line | $5 \times 10^{-5}$ | 5 |
| Dielectric interface ($SiO_2$) | — | 1 |
| Read line | — | 10 |

Figure 3:
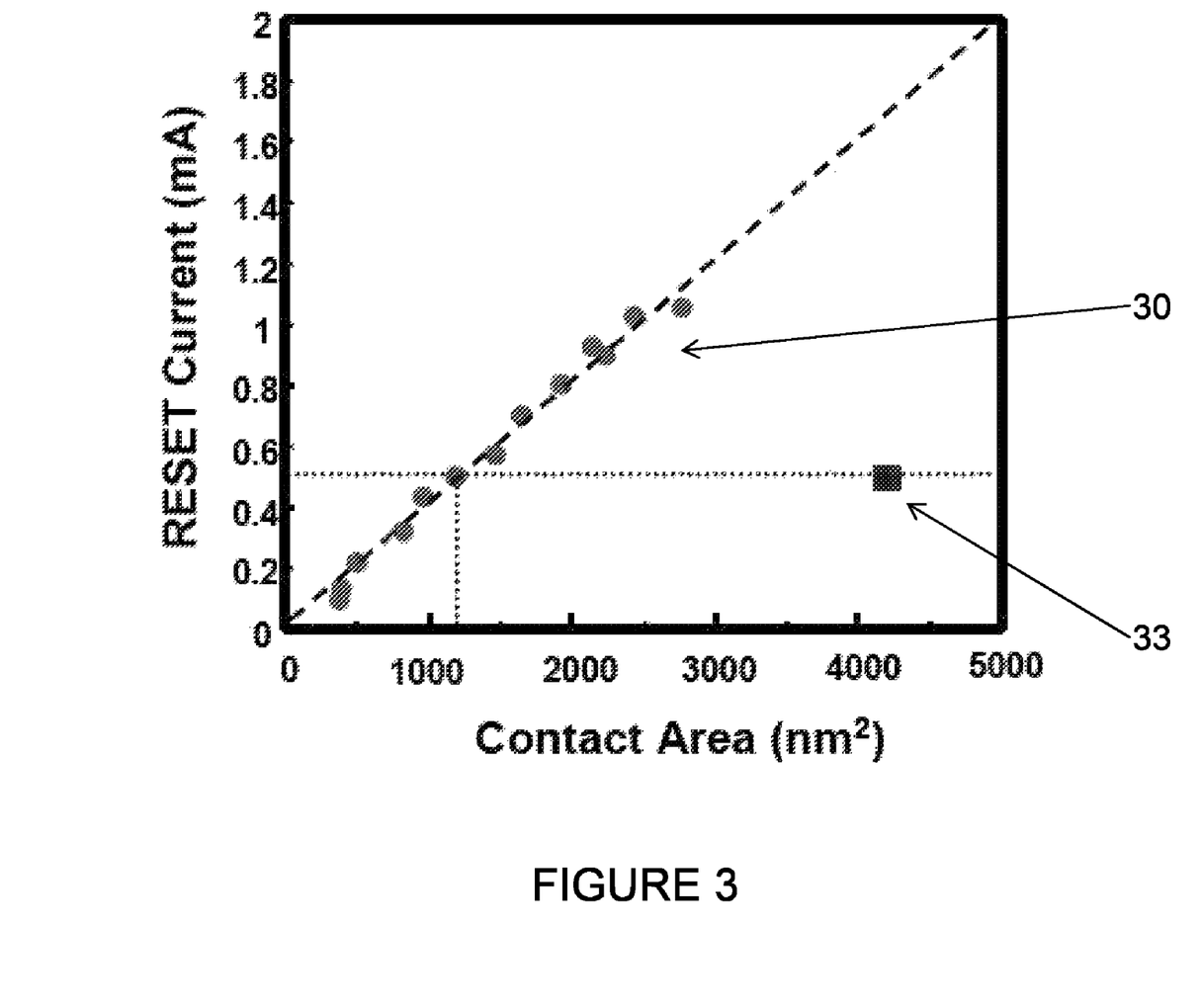
FIG. 3 is a plot of RESET current versus contact area.

FIG. 3 is a plot of RESET current versus contact area, wherein A. L. Lacaita (A. L. Lacaita, 2006, "Phase Change Memories: State of the Art, challenges and perspectives," Solid State Electronics, Vol. 50, pp. 24-31) shows an experimental scaling trend 30 of RESET programming current as a function of contact size, for a traditional PCRAM device. The plot of FIG. 3 further includes a point 33, which corresponds to the contact area of the above-described FEM model, and the resulting RESET programming current. According to FIG. 3, the RESET current for the contact area of the FEM model, is significantly less than that which is predicted for the same contact area of the traditional PCRAM device, as described by Lacaita.

In the foregoing detailed description, embodiments of the disclosure have been described. These implementations, as well as others, are within the scope of the appended claims.

We claim:

1. A memory device comprising:
a phase-change material storage cell including a first side, a second side and a third side, the first side extending between the second and third sides, the second and third sides being opposite one another and defining a width of the storage cell;
a conductive write line extending in a first direction and including a resistive heating portion for setting and resetting the storage cell, the resistive heating portion extending alongside the first side of the storage cell, a width of the resistive heating portion extending between the second and third sides of the storage cell and being less than the width of the storage cell and less than a width of the adjacent portions of the write line;
a dielectric interface extending between the resistive heating portion of the write line and the first side of the storage cell, the interface providing electrical insulation while allowing for a thermal coupling between the resistive heating portion of the write line and the first side of the storage cell; and
a conductive read line extending in a second direction and being coupled to the storage cell for passing sensing current through the storage cell.

2. The device of claim 1, wherein the read line includes a first portion, coupled to the second side of the storage cell, and a second portion, coupled to the third side of the storage cell.

3. The device of claim 1, wherein the width of the resistive heating portion of the write line is less than approximately 70 nm.

4. The device of claim 1, wherein the resistive heating portion extends, in the first direction, alongside the first side of the storage cell over a distance that is less than approximately 70 nm.

5. The device of claim 1, wherein the resistive heating portion of the write line extends approximately coplanar to the adjacent portions of the write line.

6. The device of claim 1, wherein the first side of the storage cell defines a channel of the storage cell through which the write line extends.

7. The device of claim 6, wherein the first side of the storage cell is divided into four sections to define the channel.

8. A memory device comprising:
a conductive write line extending in a first direction and including a resistive heating portion;
a phase-change material storage cell including a first side that defines a channel of the storage cell through which the write line extends in the first direction, the resistive heating portion of the write line being located within the channel for setting and resetting the storage cell;
a dielectric interface extending between the resistive heating portion of the write line and the first side of the storage cell, the interface providing electrical insulation while allowing for a thermal coupling between the resistive heating portion of the write line and the first side of the storage cell; and
a conductive read line extending in a second direction and being coupled to the storage cell for passing sensing current through the storage cell.

9. The memory device of claim 8, wherein the resistive heating portion of the write line has a width that is less than a width of adjacent portions of the write line.

10. The memory device of claim 8, wherein the resistive heating portion of the write line has a width that is less than approximately 70 nm.

11. The memory device of claim 8, wherein the resistive heating portion extends, in the first direction, through the channel of the storage cell over a distance that is less than approximately 70 nm.

12. The memory device of claim 8, wherein the resistive heating portion of the write line extends approximately coplanar to adjacent portions of the write line.

13. The memory device of claim 8, wherein the first side of the storage cell is divided into four sections to define the channel.

14. The memory device of claim 8, wherein:
the storage cell further includes a second side and a third side, opposite the second side, the second and third sides defining a width of the storage cell;
the first side extends between the second and third sides; and
the read line includes a first portion, coupled to the second side of the storage cell, and a second portion, coupled to the third side of the storage cell.

15. A memory device comprising:
a phase-change material storage cell including a first portion and a second portion, each of the first and second portions having a first side, the first sides facing one another;
a conductive write line extending in a first direction and including a resistive heating portion for setting and resetting the storage cell, the resistive heating portion extending alongside and between the first sides of the storage cell;
a dielectric interface extending between the resistive heating portion of the write line and each of the first sides of the storage cell, the interface providing electrical insulation while allowing for a thermal coupling between the resistive heating portion of the write line and the first sides of the storage cell; and
a conductive read line extending in a second direction and being coupled to the storage cell for passing sensing current through the first and second portions of the storage cell.

16. The memory device of claim 15, wherein the resistive heating portion of the write line has a width that is less than a width of adjacent portions of the write line.

17. The memory device of claim 15, wherein the resistive heating portion of the write line has a width that is less than approximately 70 nm.

18. The memory device of claim 15, wherein the resistive heating portion extends, in the first direction, alongside and between the first sides of the storage cell over a distance that is less than approximately 70 nm.

19. The memory device of claim 15, wherein the resistive heating portion of the write line extends approximately coplanar to adjacent portions of the write line.

20. The memory device of claim 15, wherein:
at least one of the first and second portions of the storage cell further includes a second side and a third side, opposite the second side, the second and third sides defining a width of the storage cell;
the first side of the at least one of the first and second portions extends between the second and third sides; and
the read line includes a first portion and a second portion, the first portion of the read line being coupled to the second side of at least one of the first and second portions of the storage cell, and the second portion of the read line being coupled to the third side of the at least one of the first and second portions of the storage cell.

21. The memory device of claim 20, wherein the resistive heating portion of the write line has a width that extends between the second and third sides of the at least one of the first and second portions of the storage cell, the width of the resistive heating portion being less than the width of the storage cell.

22. The memory device of claim 21, wherein the width of the resistive heating portion of the write line is less than a width of adjacent portions of the write line.

23. The memory device of claim 20, wherein the resistive heating portion of the write line has a width that extends between the second and third sides of the at least one of the first and second portions of the storage cell, the width of the resistive heating portion being less than a width of adjacent portions of the write line.

* * * * *